US009685315B2

(12) United States Patent
Masuda et al.

(10) Patent No.: US 9,685,315 B2
(45) Date of Patent: Jun. 20, 2017

(54) METHOD OF PRODUCING EPITAXIAL WAFER AND THE EPITAXIAL WAFER HAVING A HIGHLY FLAT REAR SURFACE

(75) Inventors: Sumihisa Masuda, Minato-ku (JP); Kazuhiro Narahara, Minato-ku (JP)

(73) Assignee: SUMCO Corporation, Minato-ku (JP)

( * ) Notice: Subject to any disclaimer, the term of this patent is extended or adjusted under 35 U.S.C. 154(b) by 766 days.

(21) Appl. No.: 13/885,382

(22) PCT Filed: Nov. 11, 2011

(86) PCT No.: PCT/JP2011/006327
§ 371 (c)(1),
(2), (4) Date: Jun. 28, 2013

(87) PCT Pub. No.: WO2012/066761
PCT Pub. Date: May 24, 2012

(65) Prior Publication Data
US 2013/0264690 A1 Oct. 10, 2013

(30) Foreign Application Priority Data
Nov. 15, 2010 (JP) ................................. 2010-255150

(51) Int. Cl.
*C30B 25/18* (2006.01)
*H01L 21/02* (2006.01)
(Continued)

(52) U.S. Cl.
CPC ...... *H01L 21/02021* (2013.01); *C30B 25/186* (2013.01); *C30B 29/06* (2013.01);
(Continued)

(58) Field of Classification Search
CPC ......... C30B 25/00; C30B 25/02; C30B 25/04; C30B 25/18; C30B 25/186; C30B 29/00;
(Continued)

(56) References Cited

U.S. PATENT DOCUMENTS

2004/0041143 A1* 3/2004 Kim .................. H01L 21/02021
257/1
2005/0202762 A1* 9/2005 Nabeya ................. B24B 53/017
451/56
(Continued)

FOREIGN PATENT DOCUMENTS

DE 40 33 683 A1 6/1991
JP 3-177023 A 8/1991
(Continued)

OTHER PUBLICATIONS

Korean Office Action dated Jul. 28, 2014, issued in corresponding Korean Application No. 10-2013-7015464, filed Nov. 11, 2011, 8 pages.
Taiwanese "Preliminary Notice of First Office Action" and Search Report dated Jun. 13, 2014, issued in corresponding Taiwanese Application No. 100141587, filed Nov. 15, 2011, 11 pages.
(Continued)

*Primary Examiner* — Kenneth A Bratland, Jr.
(74) *Attorney, Agent, or Firm* — Christensen O'Connor Johnson Kindness PLLC

(57) ABSTRACT

The present invention provides a method of producing an epitaxial wafer having a highly flat rear surface without polishing top and rear surfaces of the epitaxial wafer after forming an epitaxial film. A method of producing an epitaxial wafer 100 according to the present invention comprises a step of preparing a semiconductor wafer 10 having a beveled portion 11 formed on its end portion, a first surface 12b, a second surface 12a opposite to the first surface 12b, and edges 13b and 13a on both of the first surface 12b and the second surface 12a, the each edge 13a and 13b is boundary with the beveled portion 11; a step of processing of rolling off an outer peripheral portion 14 of the first surface 12b to form a roll-off region, the outer peripheral portion 14 is extending outward of the wafer from a predetermined position P inner than the position of the edge 13b
(Continued)

on 12*a* the first surface 12*b*; and a step of forming a first epitaxial film 20 on the second surface 12*a*.

10 Claims, 8 Drawing Sheets

(51) Int. Cl.
  *C30B 29/06* (2006.01)
  *H01L 29/30* (2006.01)
(52) U.S. Cl.
  CPC .... *H01L 21/0262* (2013.01); *H01L 21/02381* (2013.01); *H01L 21/02532* (2013.01); *H01L 21/02658* (2013.01); *H01L 29/30* (2013.01)
(58) Field of Classification Search
  CPC ......... C30B 29/02; C30B 29/06; H01L 21/00; H01L 21/02; H01L 21/02002; H01L 21/02005; H01L 21/0201; H01L 21/02021; H01L 21/02365; H01L 21/02367; H01L 21/0237; H01L 21/02378; H01L 21/02381; H01L 21/02518; H01L 21/02521; H01L 21/02524; H01L 21/02532
  USPC ....... 117/84, 88, 94, 97, 101, 106, 902, 928, 117/935
  See application file for complete search history.

(56) References Cited

U.S. PATENT DOCUMENTS

2006/0027159 A1* 2/2006 Shibayama ............. C30B 29/06
  117/19
2009/0247055 A1* 10/2009 Erk ................... H01L 21/02019
  451/44

FOREIGN PATENT DOCUMENTS

| JP | H03-177023 | * | 8/1991 |
| JP | 04-122023 | A | 4/1992 |
| JP | 6-061201 | A | 3/1994 |
| JP | 2004-319910 | A | 11/2004 |
| JP | 2005209862 | A | 8/2005 |
| JP | 2006190703 | A | 7/2006 |
| TW | 201000693 | A1 | 1/2010 |
| TW | 201013770 | A1 | 4/2010 |
| WO | 2012/066761 | A1 | 5/2012 |

OTHER PUBLICATIONS

Korean Office Action issued in corresponding Korean Application No. 10-2013-7015464, mailed Jan. 16, 2014, 5 pages.
International Search Report mailed Dec. 13, 2011, issued in corresponding International Application No. PCT/JP2011/006327, filed Nov. 11, 2011, 2 pages.
Examination Report mailed Apr. 16, 2015, issued in corresponding German Application No. 11 2011 103 769, filed Nov. 11, 2011, 14 pages.

* cited by examiner (a)

(b)

(c)

(a)

(b)

(a)

(b)

(a)

(b)

(a)

(b)

METHOD OF PRODUCING EPITAXIAL WAFER AND THE EPITAXIAL WAFER HAVING A HIGHLY FLAT REAR SURFACE

TECHNICAL FIELD

The present invention relates to a method of producing an epitaxial wafer and the epitaxial wafer. The present invention particularly relates to a method of producing an epitaxial wafer by which an epitaxial wafer having a highly flat rear surface can be obtained without polishing top and rear surfaces of the epitaxial wafer after forming an epitaxial film and the epitaxial wafer obtained thereby.

BACKGROUND ART

An epitaxial wafer is a high quality wafer forming a single crystal silicon layer (epitaxial film) having a thickness of several micrometers on such as a silicon substrate by typically vapor-growing. An epitaxial silicon wafer is advantageous in that a wafer heavily doped with dopants such as boron (B) or phosphorus (P) can be produced in response to requests from device manufacturers or the like.

A conventional general method of producing an epitaxial wafer will be described with reference to FIG. 8. FIG. 8(a) shows the vicinity of an end of a semiconductor wafer 40 with a beveled portion 41 formed on its end portion. An epitaxial film 50 is formed on a top surface 42a of this semiconductor wafer 40 (FIG. 8(b)) to form an epitaxial wafer 200. Recent epitaxial growth techniques have been making it possible to form the epitaxial film 50 having a uniform thickness all over with respect to the top surface 42a of the semiconductor wafer 40.

However, with respect to the rear surface 42b of the semiconductor wafer 40, when epitaxial growth is performed, a reactive gas used to form the epitaxial film reaches the rear surface 42b, so that an epitaxial film 60 attaches to an outer peripheral portion 44 of the rear surface 42b of the semiconductor wafer. Therefore, although the thickness of the epitaxial film 50 itself is uniform, the thickness profile of the epitaxial wafer 200 including the semiconductor wafer 40 in the wafer diameter direction is the thickness profile including additional thickness of the epitaxial film 60 attached to the outer peripheral portion 44. As a result, there has been a problem in that the flatness of the whole epitaxial wafer degrades. In particular, as the thickness of the formed epitaxial film 50 increases, the thickness of the epitaxial film 60 attached to the outer peripheral portion 44 of the rear surface 42b increases accordingly. This further degrades the flatness. Note that, in this specification, one of the surfaces of a semiconductor wafer, on which a main epitaxial film is grown, is referred to as a "top surface" of the semiconductor wafer, and the other surface opposite thereto is referred to as a "rear surface" of the semiconductor wafer as above.

As the design rules get smaller with recent increase in the integrity of semiconductor devices, severer flatness has been demanded on involving epitaxial silicon wafers. Further, it is desirable to obtain as many devices as possible from one wafer, and as wafers have larger diameters, a flat shape has been required throughout the surface of the wafers, especially even at the edge portions thereof (wafer end portion). The measurement exclusion range of flatness of a wafer surface (edge exclusion) has been conventionally 3 mm from the wafer edge, it is now 2 mm progressively, and even further reduction to 1 mm is almost challenged.

Under these circumstances, in order to improve flatness of epitaxial wafers, Patent Literature 1 discloses a producing method in which a step of mirror-polishing a top surface or both surfaces of an epitaxial wafer is performed after forming an epitaxial film. Further, Patent Literature 2 and Patent Literature 3 describe techniques of mirror-polishing an epitaxial film surface after forming the epitaxial film.

CITATION LIST

Patent Literature

Patent Literature 1: JP 04-122023
Patent Literature 2: JP 2005-209862
Patent Literature 3: JP 2006-190703

SUMMARY OF INVENTION

Technical Problem

Actually, the inventions disclosed in those three prior art documents allow mechanical polishing of a top surface or both top and rear surfaces of an epitaxial wafer, which can improve flatness of the surface(s) of the epitaxial wafer. In particular, as mentioned in Patent Literature 1, if both surfaces of an epitaxial wafer are mirror-polished after forming an epitaxial film, the epitaxial film 60 shown in FIG. 8(b) can be eliminated, and the epitaxial wafer having a top surface and a rear surface both with high flatness can be obtained.

However, since the epitaxial film surface is very active, polishing of the epitaxial film surface would create scratches or a PID (Polishing Induced Defect) that is a defect caused by processing an epitaxial film surface. Further, the process step of polishing an epitaxial wafer leads to increase in the production cost. Moreover, in order to mirror-polish the rear surface of the epitaxial wafer, the surface on the rear side of the epitaxial wafer is required to be polished while holding a top surface of the epitaxial film by adsorption using a vacuum adsorption member or the like. Accordingly, flaws or contact marks are generated on the top surface of the epitaxial film, which would cause deterioration in the quality of the epitaxial film. Therefore, there has been a demand for a method for realizing high flatness on the rear surface including an outer peripheral portion without polishing both surfaces, especially the rear surface, of the epitaxial wafer after forming the epitaxial film.

Taking the above problems into consideration, an object of the present invention is to provide a method of producing an epitaxial wafer having a highly flat rear surface which can be obtained without polishing top and rear surfaces of the epitaxial wafer after forming an epitaxial film and to provide the epitaxial wafer which can be obtained thereby.

Solution to Problem

After the inventors have made various studies, they changed their mindset to arrive at the possibility of achieving the expected object by instead of removing an epitaxial film attached to an outer peripheral portion of a rear surface of a semiconductor wafer after forming an epitaxial film, previously rolling off the outer peripheral portion of the rear surface of the semiconductor wafer purposely. Thus, they accomplished the present invention.

The present invention is based on the above knowledge and studies, and it primarily includes the following components.

(1) A method of producing an epitaxial wafer comprises a step of preparing a semiconductor wafer having a beveled portion formed on its end portion, a first surface, a second surface opposite to the first surface, and edges on both of the first surface and the second surface, the each edge is boundary with the beveled portion; a step of processing of rolling off an outer peripheral portion of the first surface to form a roll-off region, the outer peripheral portion is extending outward of the wafer from a predetermined position inner than the position of the edge on the first surface; and a step of forming a first epitaxial film on the second surface.

(2) In the method of producing an epitaxial wafer according to (1) above, a roll-off amount of the outer peripheral portion may be determined based on a film thickness of a second epitaxial film which attaches to the outer peripheral portion of the first surface when the first epitaxial film is formed on the second surface.

(3) In the method of producing an epitaxial wafer according to (1) or (2) above, the rolling-off step may be performed by a polishing process.

(4) The method of producing an epitaxial wafer according to (3) above may further comprise a step of rough-polishing at least one of the first surface and the second surface of the semiconductor wafer, and in the method, the process of polishing the outer peripheral portion is performed after the rough-polishing step.

(5) The method of producing an epitaxial wafer according to (3) or (4) above may further comprise a step of finish-polishing at least the second surface of the semiconductor wafer before the step of forming the first epitaxial film, and in the method, the process of polishing the outer peripheral portion is performed before the finish-polishing step.

(6) In the method of producing an epitaxial wafer according to any one of (3) to (5) above, the process of polishing the outer peripheral portion may be performed by using a ring-shaped polishing cloth having a size corresponding to the outer peripheral portion of the first surface.

(7) The method of producing an epitaxial wafer according to (3) above may further comprise a step of rough-polishing at least one of the first surface and the second surface of the semiconductor wafer, and a step of finish-polishing at least one of the first surface and the second surface of the semiconductor wafer before the step of forming the first epitaxial film, and in the method, a process of mirror-polishing of the beveled portion and the process of polishing of the outer peripheral portion can be performed in parallel between the rough-polishing step and the finish-polishing step.

(8) An epitaxial wafer comprises a semiconductor wafer having a beveled portion formed on its end portion, a first surface, a second surface opposite to the first surface, and edges on both of the first surface and the second surface, the each edge is boundary with the beveled portion; a first epitaxial film with a thickness of 3 μm or more formed on the second surface of the semiconductor wafer; and a second epitaxial film formed on an outer peripheral portion of the first surface, and in the epitaxial wafer, an ESFQRmean value which represents the flatness of a surface including at least a surface of the second epitaxial film on the first surface is 100 nm or less.

Advantageous Effects of Invention

According to the present invention, an outer peripheral portion of a rear surface of a semiconductor wafer is previously rolled off purposely before forming an epitaxial film and then the epitaxial film is formed. Thus, the present invention can provide an epitaxial wafer having a highly flat rear surface obtained without polishing top and rear surfaces of the wafer after forming the epitaxial film and a method of producing the same.

BRIEF DESCRIPTION OF DRAWINGS

FIG. 3(a) is a schematic cross-sectional view of the vicinity of the outer peripheral portion of the wafer, and FIG. 3(b) is a schematic top view of the wafer and a polishing pad;

FIG. 5(a) illustrates an epitaxial wafer obtained by Experiment Example 1 (Comparative Example), and FIG. 5(b) illustrates an epitaxial wafer obtained by Experiment Example 3 (Example);

DESCRIPTION OF EMBODIMENTS

Figure 1:
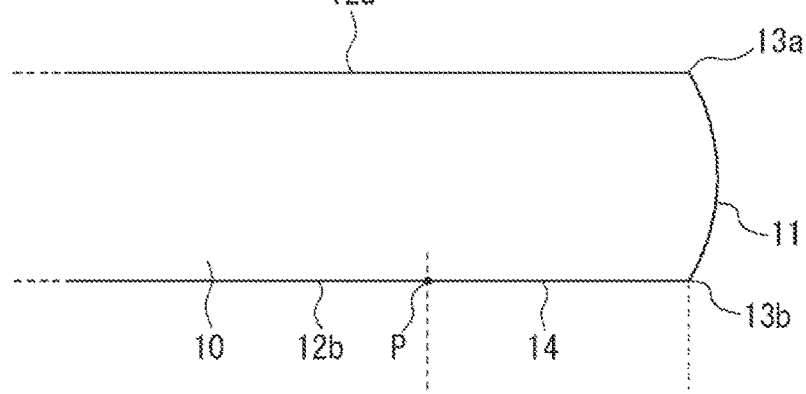
FIG. 1 is a schematic cross-sectional view illustrating a representative method of producing an epitaxial wafer in accordance with the present invention.
Figure 1:
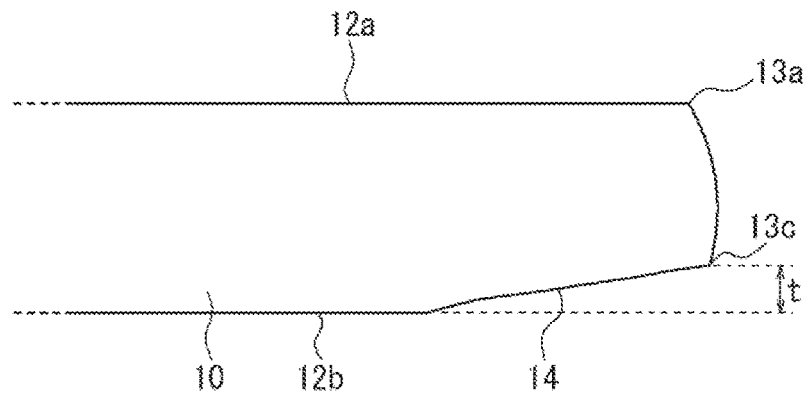
Figure 1:
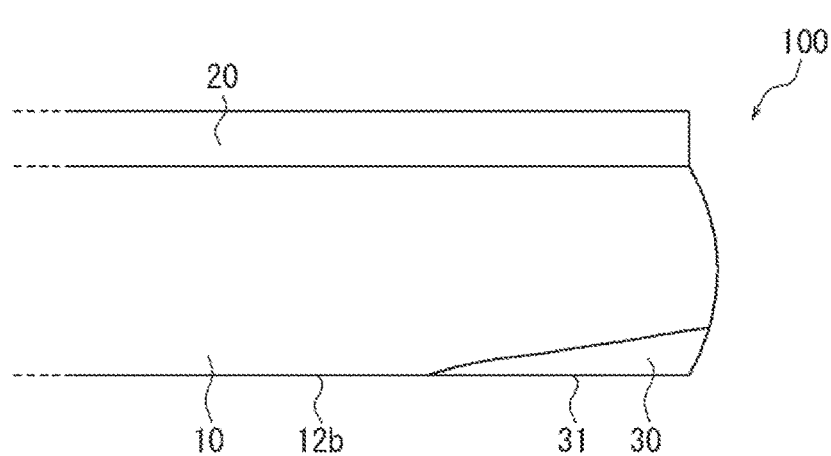

The present invention will be described below in more detail with reference to the accompanying drawings. In principle, the same components are denoted by the same reference numeral, and the description will not be repeated.

(Method of Producing Epitaxial Wafer)

FIG. 1 is a schematic cross-sectional view illustrating a representative method of producing an epitaxial wafer in accordance with the present invention, which only illustrates the vicinity of an end portion of the wafer. First, a semiconductor wafer 10 is prepared (FIG. 1(a)). Examples of the semiconductor wafer 10 may include a silicon wafer which is obtained by cutting a single crystal silicon ingot into slices using a wire saw or the like and then treated with a planarizing process such as lapping or grinding. This semiconductor wafer 10 has a beveled portion 11 formed on its end portion, a top surface 12a as a second surface, a rear surface 12b as a first surface opposite to the top surface 12a, and edges 13a and 13b on the surfaces 12a and 12b, which form boundaries between the beveled portion 11 and the surfaces 12a and 12b, respectively. After beveling the end portion, the semiconductor wafer 10 can be rough-polished.

At least one or preferably both of the surfaces 12a and 12b of the semiconductor wafer may be rough-polished. The rough-polishing is a mirror-polishing process performed for the purpose of removing a working strain layer introduced by lapping or grinding and controlling the surface profile (flatness). For example, a double-side polishing apparatus including a carrier for receiving a semiconductor wafer, an upper plate and a lower plate between which the carrier is sandwiched and each attached with a hard polishing cloth such as polyurethane is used to mirror-polish the both surfaces of the wafer to obtain a flat shape. During the mirror-polishing, an abrasive slurry containing free abrasive grains (colloidal silica, diamond abrasive grains, alumina abrasive grains, or the like) having an average grain diameter of 30 nm to 100 nm is supplied onto the surfaces to be polished. The rough-polishing step may be performed using a varied kind of polishing cloth and a rough-polishing solution containing free abrasive grains having varied sizes, and the amount of polishing on the surfaces of the silicon wafer to be polished is for example processed in two or three stages separately.

After that, the beveled portion 11 can be mirror-polished. Note that the beveled portion 11 may be mirror-polished before the rough-polishing step. The wafer which has been etched is polished to be mirrored by bearing the end portion of the wafer on the polishing cloth while supplying the polishing solution as well as rotating the wafer. The kind of the polishing cloth is not limited. For example, a single-layer polishing cloth or a two-layer polishing cloth in which a sponge layer is formed on the rear surface of a polishing cloth layer may be used. As the polishing cloth layer of the single-layer polishing cloth and the two-layer polishing cloth, for example, a polishing cloth composed of a synthetic resin foam such as urethane foam, a polishing cloth of a hard velour type in which a non-woven cloth made of polyester fabric is impregnated with a urethane resin, or a suede pad in which a urethane resin had foamed on a non-woven base fabric. As an abrasive liquid (polishing agent) to be supplied to the polishing cloth, an alkaline solution in which free abrasive grains such as pyrogenic silica or colloidal silica are dispersed can be used.

Next, an outer peripheral portion 14 of the rear surface 12b which is one of the surfaces of the semiconductor wafer 10 is rolled off; thus, this outer peripheral portion 14 is defined as a roll-off region (FIG. 1(b)). The outer peripheral portion 14 of the rear surface 12b is a region extending outward of the wafer from a predetermined position P inner than the position of the edge 13b on the rear surface 12b as shown in FIG. 1(a). The size and the roll-off amount of the outer peripheral portion 14 defined as the roll-off region will be described below. Note that "a roll-off amount" here means the amount of separation between an edge 13c position of the rear surface 12b of the wafer after rolling off the wafer and the edge 13b position of the rear surface 12b which is flat without roll-off (see FIG. 1(a)) in the thickness direction (separation amount t) as shown in FIG. 1(b).

Subsequently, before a step of forming a first epitaxial film 20, finish-polishing may be performed to reduce surface roughness of the top surface of the rolled off semiconductor wafer 10. The finish-polishing is different from polishing for controlling flatness of a silicon wafer, such as the rough-polishing, and is performed to reduce slight undulations and the haze level on the wafer surface. The finish-polishing corresponds to mirror-polishing performed by bearing a surface of the semiconductor wafer 10 to be polished on a rotating soft abrasive cloth while supplying an abrasive slurry to the surface to be polished. For example, a single wafer polishing apparatus may be used, or a batch polishing apparatus which simultaneously polishes a plurality of silicon wafers may be used. Naturally, one side polishing only for the semiconductor wafer surface 12a or double side polishing for simultaneously processing the top surface 12a and the rear surface 12b may be performed. Further, finish-polishing may be performed in a plurality of stages using varied kinds of polishing clothes or abrasive slurries with varied compositions. In finish-polishing, an alkaline aqueous solution containing free abrasive grains can be used as finishing abrasive liquid. For example, an alkaline aqueous solution can be used, in which free abrasive grains such as colloidal silica (abrasive grains), diamond abrasive grains, or alumina abrasive grains are mixed. Thus, the surface of the silicon wafer to be polished is polished mainly by mechanical grinding action due to free abrasive grains and by chemical action of alkali. An average grain size of free abrasive grains added to the alkaline aqueous solution used for the finishing abrasive liquid may be selected in the range of grain sizes which do not make the abrasive grains aggregate, and the average grain size may be desirably 10 nm to 50 nm. As a polishing cloth for finish-polishing, a soft polishing cloth is suitable unlike a hard polishing cloth for rough-polishing such as polyurethane. Specifically, a velour type or a suede type may be used. The velour type polishing cloth is a so-called non-woven cloth having a single layer structure, which has a composite structure of a porous sheet material. The suede type polishing cloth is an artificial leather for industrial materials in a manner of speaking, which is composed of a base layer of a non-woven cloth having a composite structure of synthetic fabric and special synthetic rubber, and a surface layer in which many fine pores are formed in a polymer resin such as polyester resin, polyether resin, or polycarbonate resin which are excellent in wear resistance.

The first epitaxial film 20 is then formed on the top surface 12a which is the other surface opposite to the rear surface 12b (FIG. 1(c)). In epitaxial growth, the silicon wafer is transversely set in a susceptor so that the top and rear surfaces of the wafer are horizontal. Next, in order to remove natural oxide films or particles on the surfaces of the silicon wafer, hydrogen gas is supplied into a chamber to perform hydrogen bake at a temperature of 1150° C. for 60 seconds. Thereafter, a carrier gas ($H_2$ gas), a source gas (such as silicon tetrachloride, monosilane ($SiH_4$), trichlorosilane ($SiHCl_3$), or dichlorosilane ($SiH_2Cl_2$)), and a dopant gas (such as diborane ($B_2H_6$) or phosphine ($PH_3$)) are supplied into the chamber to grow a 2 to 100 μm-thick epitaxial film on the surface of the silicon wafer heated at 1000° C. to 1150° C.

Figure 8:
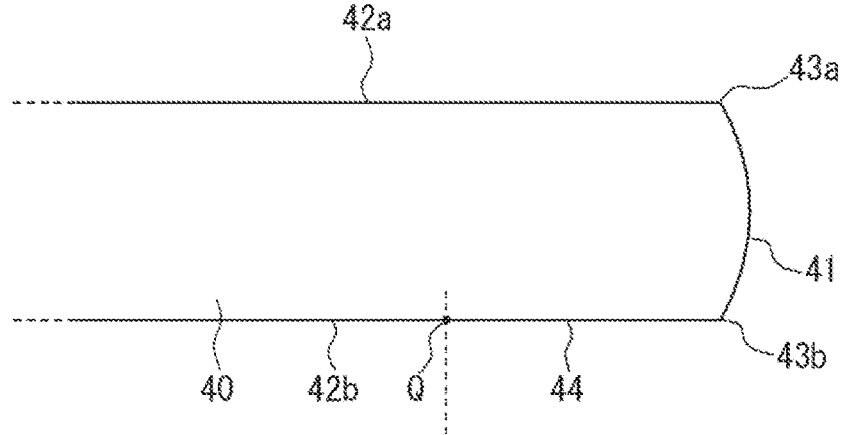
FIG. 8 is a schematic cross-sectional view illustrating a conventional method of producing an epitaxial wafer.
Figure 8:
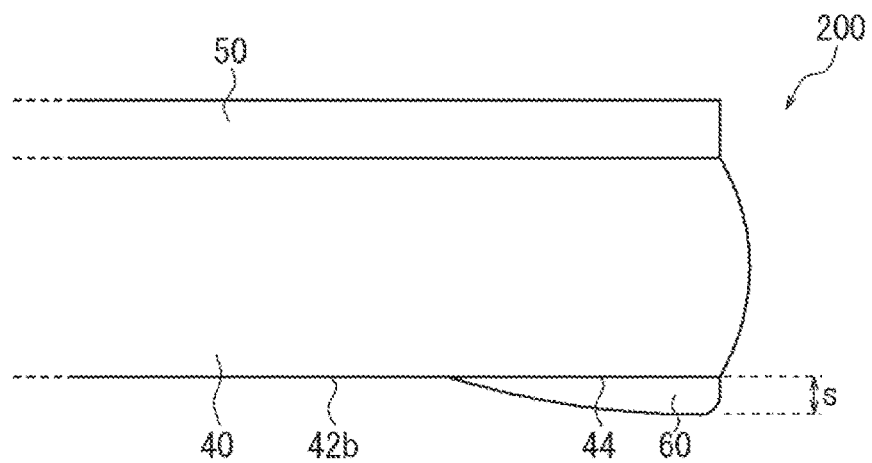

At this time, a reactive gas used for forming the first epitaxial film 20 reaches the rear surface 12b of the semiconductor wafer 10, so that a second epitaxial film 30 attaches to the outer peripheral portion 14 of the rear surface 12b of the semiconductor wafer, which is defined as the roll-off region. Note that, conventionally, as shown in FIG. 8(b), when an epitaxial film 60 is formed on the outer peripheral portion 44 of a rear surface, the flatness of the rear surface of the epitaxial wafer 200 is degraded. However, in a production method of the present invention, only the outer peripheral portion 14 of the rear surface 12b of the semiconductor wafer is previously rolled off purposely before forming the first epitaxial film 20, and the first epitaxial film 20 is formed after that. Therefore, the second epitaxial film 30 attaches to the outer peripheral portion 14 that is the roll-off region. This provides high flatness for the rear surface of an epitaxial wafer 100 without polishing the rear surface 12b of the wafer after forming the first epitaxial film 20. Thus, the epitaxial wafer 100 having a uniform thickness profile, that is, high flatness, even on the outer peripheral portion can be obtained without polishing the top and rear surfaces of the epitaxial wafer 100.

The roll-off amount t of the outer peripheral portion 14 is preferably determined based on a film thickness of the second epitaxial film which attaches to the outer peripheral portion 14 of the rear surface 12b when the first epitaxial film 20 is formed on the top surface 12a of the semiconductor wafer 10. This allows a surface 31 of the second epitaxial film 30 to become flush with the rear surface 12b of the semiconductor wafer, which can further increase the flatness of the rear surface of the epitaxial wafer 100.

A specific example will be described below. As shown in FIG. 8(b), when an epitaxial film is formed without rolling off an outer peripheral portion of its rear surface, the maximum film thickness of the epitaxial film 60 which attaches to the outer peripheral portion 44 of the rear surface is referred to as maximum film thickness s. Since a reactive gas reaches and runs over the rear surface from the top surface, the maximum film thickness s of the epitaxial film which attaches to the outer peripheral portion 44 of the rear surface is observed at an edge position of the outer peripheral portion 44 of the wafer rear surface. In view of this, the roll-off amount t is set equal to the maximum film thickness s. In other words, the above maximum film thickness s is experimentally found in advance under the epitaxial conditions of the first epitaxial film 20 in producing the epitaxial wafer, and the outer peripheral portion 14 of the rear surface 12b is rolled off with the roll-off amount equal to the maximum film thickness s experimentally found. Note that reference numerals 43a and 43b denote the edges of the surfaces 42a and 42b of the semiconductor wafer 40, while Q denotes an innermost position of the outer peripheral portion, to which the epitaxial film 60 attaches.

Describing the specific example in more detail, there is a direct correlation between the film thickness of the first epitaxial film 20 to be formed on the top surface 12a of the semiconductor wafer 10 and the maximum film thickness s of the second epitaxial film 30 which attaches to the outer peripheral portion 14 of the rear surface 12b when the first epitaxial film 20 is formed. Therefore, the relationship is found in advance and tabulated, so that a suitable roll-off amount can be selected in accordance with the film thickness of the first epitaxial film 20 to be formed in producing the epitaxial wafer 100.

Further, the innermost position Q of the outer peripheral portion to which the epitaxial film 60 attaches is usually in a region of 5 mm or less aside from the edge 13b on the rear surface although depending also on the epitaxial growth conditions. Hence, the outer peripheral portion 14 defined as the roll-off region may be a region of 5 mm or less aside from the edge 13b on the rear surface. Accordingly, the predetermined inner position P of the rear surface 12b in FIG. 1(a) is in a region of 5 mm or less aside from the edge 13b on the rear surface side. This is because according to general epitaxial conditions, the second epitaxial film 30 attaches to a region which is 5 mm or less aside from the edge 13b on the rear surface side and if a region to which the second epitaxial film 30 does not attach is also rolled off, the flatness of the rear surface 12b is degraded, which would adversely affect a device. Note that, although not essential, when more precise flatness is required, the position of Q under the epitaxial conditions in a predetermined apparatus may be experimentally found in advance like the roll-off amount, to roll off so that the position P corresponds to the position of Q experimentally found.

Note that the roll-off region is formed adjacent to the beveled portion 11 on the rear surface 12b of the semiconductor wafer. Here, the beveled portion 11 extends in the diameter direction and thickness direction of the wafer in a range of a several hundred micrometers order. Meanwhile, the roll-off region has a width of 5 mm or less that is a several millimeters order in the diameter direction as described above, while the roll-off amount is in a range of about 50 nm to 500 nm. Therefore, the inclination of the beveled portion 11 with respect to the wafer diameter direction is actually far greater than that of the outer peripheral portion 14 which is the roll-off region. Given this situation, in all the cross-sectional views including FIG. 1, in order to show the inclination of the outer peripheral portion 14 with respect to the wafer diameter direction in a visible manner, the wafer is significantly magnified in the thickness direction. Thus, the beveled portion 11 is illustrated to be almost perpendicular to the wafer diameter direction. Since the beveled portion 11 is a region which is not used for device manufacturing, in all the drawings including FIG. 1, an epitaxial film which attaches to the beveled portion 11 is omitted.

(Method of Rolling-Off Step)

The rolling-off step is preferably performed by a process of polishing the outer peripheral portion. This allows the roll-off region to be formed with the roll-off amount in the range of nanometers order as described above without causing working damage or the like to the rear surface 12b of the semiconductor wafer 10. A polishing cloth used for the roll-off process may be the same polishing cloth as being used for mirror-polishing of the foregoing beveled portion.

For example, the semiconductor wafer 10 is set on a stage rotating about the center of the wafer as the rotation center. While rotating the semiconductor wafer 10, the polishing member is bore on the outer peripheral portion 14 of the rear surface 12b to polish only the outer peripheral portion. The rotation of the semiconductor wafer 10 allows the whole outer peripheral portion of the wafer to be uniformly polished with an equal width. Further, the roll-off amount t can be controlled by the pressure applied by bearing the polishing member on the semiconductor wafer, and polishing time. Moreover, the width of the roll-off region may be controlled by the angle of the polishing member against the semiconductor wafer 10 in addition to the pressure and the polishing time.

Preferably in the present invention, as in the order of process steps described above, after the step of rough-polishing at least one or preferably both of the surfaces 12a and 12b of the semiconductor wafer 10, the process of polishing the outer peripheral portion 14, that is the roll-off process is performed. This is because the roll-off region is not removed by rough-polishing in the above order since the roll-off amount is about 50 nm to 500 nm while the grinding amount of the rough-polishing is very large as 5 mm to 30 mm.

Further, as in the above-mentioned order, the step of finish-polishing at least the top surface 12a or both the top and rear surfaces 12a and 12b of the semiconductor wafer 10 may be performed before the step of forming the first epitaxial film 20 (FIG. 1(c)), and the process of polishing the outer peripheral portion 14, which is the roll-off process is preferably performed before the finish-polishing step. This is preferable because the above order would not cause quality loss due to scattering of abrasive slurry for the wafer surface (the surface to be subjected to epitaxial growth) which has been subjected to the final finish-polishing. Alternatively, the semiconductor wafer surface may be devised by attaching a slurry scatter barrier or the like thereto to perform the process of polishing the outer peripheral portion 14 after the final finish-polishing.

Two specific examples of process methods of polishing the outer peripheral portion 14 of the rear surface will be shown below.

Figure 2:
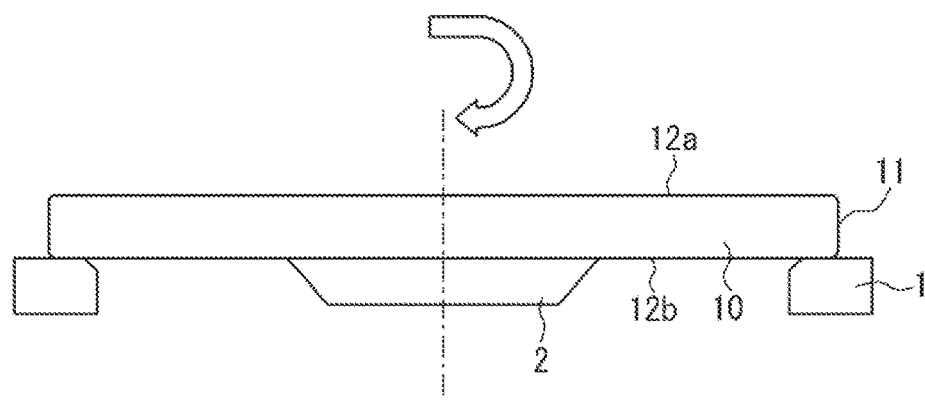
FIG. 2 is a schematic cross-sectional view illustrating an example of a method of polishing an outer peripheral portion of a wafer rear surface in a method of producing an epitaxial wafer in accordance with the present invention, where polishing is performed by using a ring-shaped polishing cloth.

FIG. 2 is a schematic cross-sectional view illustrating an example of a method of polishing the outer peripheral portion of the wafer rear surface in a method of producing an epitaxial wafer according to the present invention. The apparatus shown in FIG. 2 includes, for polishing the outer peripheral portion 14 of the semiconductor wafer 10, a rotation stage 2 which holds the semiconductor wafer 10 and rotates about the central axis, and a ring-shaped polishing cloth 1 having a size corresponding to the outer peripheral portion 14. The ring-shaped polishing cloth 1 polishes only a region of about 2 mm to 5 mm from the edge of the rear surface. The ring-shaped polishing cloth 1 rotates in the direction opposite to the rotation direction of the wafer 10. Using the ring-shaped polishing cloth 1, the ring-shaped polishing cloth 1 can be uniformly bore on the outer peripheral portion of the wafer, which prevents stress concentration on a part of the wafer 1.

Figure 3:
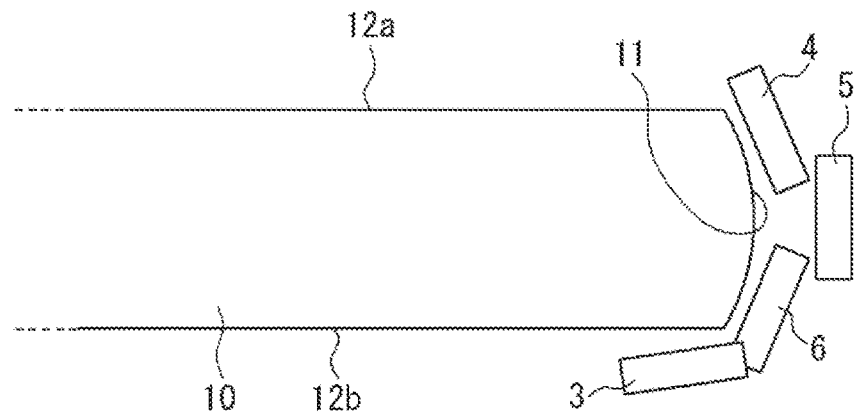
FIGS. 3(a) and 3(b) are views illustrating a case of another example of a method of polishing an outer peripheral portion of a wafer rear surface in a method of producing an epitaxial wafer in accordance with the present invention, in which a process of mirror-polishing of a beveled portion and a process of polishing of an outer peripheral portion of a rear surface are performed in parallel; specifically.
Figure 3:
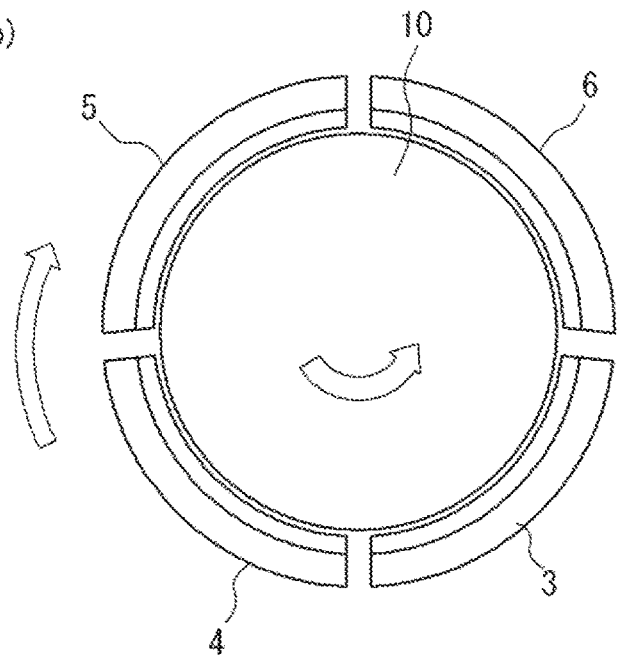

FIG. 3 is a view for illustrating another example of polishing the outer peripheral portion of the wafer rear surface in a method of producing an epitaxial wafer in accordance with the present invention. In the methods described above, mirror-polishing of the beveled portion 11 is performed before or after the step of rough-polishing the semiconductor wafer, separately from the roll-off process of the present invention. In a method using the apparatus shown in FIG. 3, the process of mirror-polishing of the beveled portion 11 and the process of polishing the outer peripheral portion 14, that is the roll-off process are performed in parallel between the step of rough-polishing the semiconductor wafer and the finish-polishing step.

FIG. 3(a) and FIG. 3(b) are views schematically showing this method. A polishing pad 3 is a polishing pad for polishing (rolling off) the outer peripheral portion 14 of the rear surface 12b. Polishing pads 4, 5, and 6 are polishing pads for mirror-polishing of the beveled portion 11. The polishing pad 4 is for polishing the upper surface of the semiconductor wafer 10, the polishing pad 6 is for polishing the lower surface of the semiconductor wafer 10, and the polishing pad 5 is for polishing the apex (outermost end portion) of the semiconductor wafer 10. FIG. 3(a) shows an illustration which makes it easier to understand the angle of each polishing pad against the semiconductor wafer. Actually, those four polishing pads are arranged at different circumferential positions on the outer peripheral portion 14, for example, in each of the regions obtained by dividing the outer periphery of the semiconductor wafer into quarters as shown in FIG. 3(b) so that the four polishing pads 3, 4, 5, and 6, contact the outer peripheral portion 14 of the rear surface of the semiconductor wafer 10. So processing of the beveled portion 11, mirror-polishing of the beveled portion 11, and polishing of the outer peripheral portion 14 of the rear surface can be performed in parallel by rotating the semiconductor wafer 10 by using the rotation stage. Further, such an apparatus is preferable also because it can be obtained by mirror modification of a conventional apparatus for mirror-polishing the beveled portion 11 of the wafer.

(Epitaxial Wafer)

Figure 4:
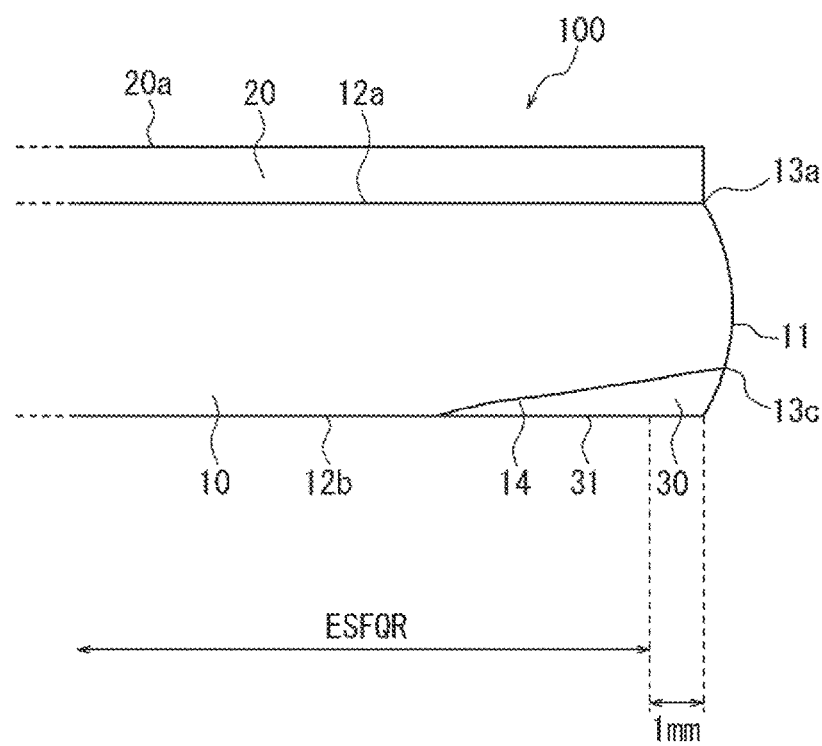
FIG. 4(a) is a schematic cross-sectional view illustrating a representative epitaxial wafer in accordance with the present invention.
FIG. 4(b) is a view for explaining ESFQR.
Figure 4:
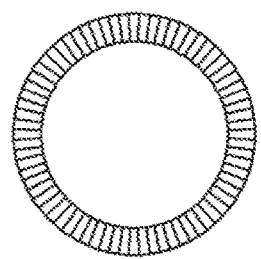

The epitaxial wafer 100 which can be obtained by the production method described heretofore will be described with reference to FIG. 4. The epitaxial wafer 100 comprises a semiconductor wafer 10 having a beveled portion 11 formed on its end portion, a top surface 12a as a second surface, a rear surface 12b as a first surface opposite to the top surface 12a, and edges 13a and 13b on the surfaces 12a and 12b, which form boundaries between the beveled portion 11 and the surfaces 12a and 12b, respectively; a first epitaxial film 20 having a thickness of 3 μm or more which is formed on the top surface 12a of the semiconductor wafer 10; and a second epitaxial film 30 which is formed only on the outer peripheral portion 14 on the rear surface 12b. Despite the existence of the second epitaxial film 30 attached on the rear surface 12b, an ESFQRmean value which is the flatness of a surface including at least the second epitaxial film surface 31 on the rear surface 12b is characteristically 100 nm or less since the outer peripheral portion 14 includes the roll-off region.

Here, when the film thickness of the first epitaxial film 20 formed on the surface 12a is very thin, a small amount of the second epitaxial film 30 accordingly attaches to the outer peripheral portion 14 of the rear surface. Therefore, a relatively flat rear surface can be obtained without applying a production method of the present invention. However, the epitaxial wafer 100 characteristically has an ESFQRmean value of 100 nm or less even though the first epitaxial film 20 is formed thereon with a thickness of 3 μm or more.

ESFQR (Edge flatness metric, Sector based, Front surface referenced, least sQuares fit reference plane, Range of the data within sector) here means SFQR measured inside a fan-shaped region (sector) formed on the entire outer peripheral area of the wafer. ESFQRmax means a maximum value among ESFQRs of all the sectors on the wafer. ESFQRmean is a mean value of ESFQRs of all the sectors. ESFQR prescribed by the present invention is a value measured in a sector (site size) obtained by dividing the entire periphery of the wafer evenly into 72 sectors and having a sector length of 30 mm in the diameter direction by using a flatness measuring apparatus (Wafer Sight manufactured by KLA-Tencor corporation). Note that the measurement exclusion range (Edge Exclusion) here is 1 mm (see FIG. 4(a)). FIG. 4(b) is a plan view illustrating the shape of sectors for calculating ESFQR. The fan-shaped regions of the outer peripheral portion are the regions for measuring ESFQR. ESFQRmean is an index representing the flatness of the outer peripheral portion of the semiconductor wafer except for the beveled portion 11.

Note that SFQR (Site Front Least Squares Range) refers to a value obtained about each of the site, which is the sum of absolute values of maximum displacement amounts of both the positive side and the negative side from a reference plane in the site which is obtained by calculation of the data using a least square method in the prescribed site. The positive side means the upper side of the wafer horizontally placed with its main surface facing upward and the negative side means the lower side in the like manner.

The present invention has been described in the foregoing descriptions to show only examples of typical embodiments.

The present invention is not limited to those embodiments, and various modifications can be made within the scope of the present invention.

EXAMPLES

Experiment Example 1

Comparative Example

In this experiment example, in order to check the degree of degradation in the flatness of the rear surface of a wafer, caused by epitaxial growth, the following experiment was performed. First, a silicon wafer (crystal orientation (100), p-type) with a diameter of 300 mm, of which top and rear surfaces and beveled portion had been mirror-polished was prepared. Specifically, after mirror-polishing (rough-polishing) the top and rear surfaces of the silicon wafer using a double-side polishing apparatus, finish-polishing for removing 0.5 mm of the silicon wafer from the top surface thereof was performed using a single-side polishing apparatus.

First, this silicon wafer was set on a susceptor in a single wafer epitaxial apparatus and a hydrogen gas was supplied into a chamber to perform hydrogen bake at a temperature of 1150° C. for 60 seconds. A growth source gas (trichlorosilane) and a dopant gas (diborane) were then supplied into the chamber with the hydrogen gas which is a carrier gas to perform epitaxial growth at a temperature of 1150° C. to form a first epitaxial film with a thickness of 5 μm on the silicon wafer surface. Thus, an epitaxial silicon wafer was formed.

Figure 5:
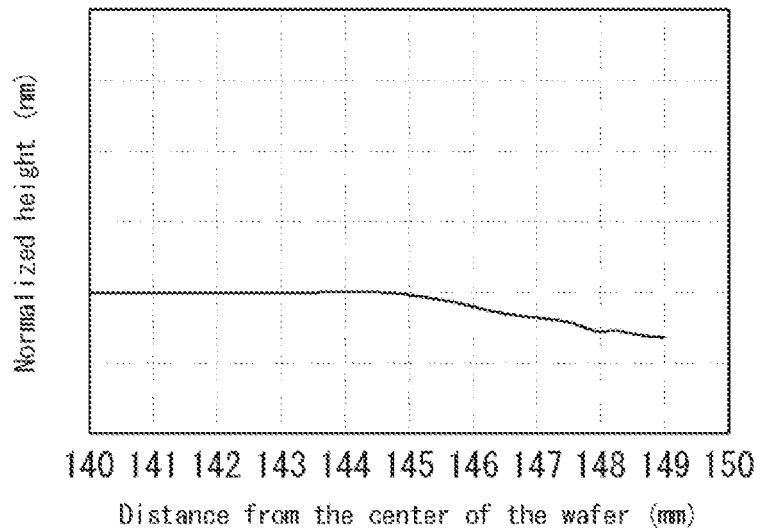
FIGS. 5(a) and 5(b) are graphs showing height profiles in the vicinity of an outer peripheral portion of a rear surface of an epitaxial wafer; specifically.
Figure 5:
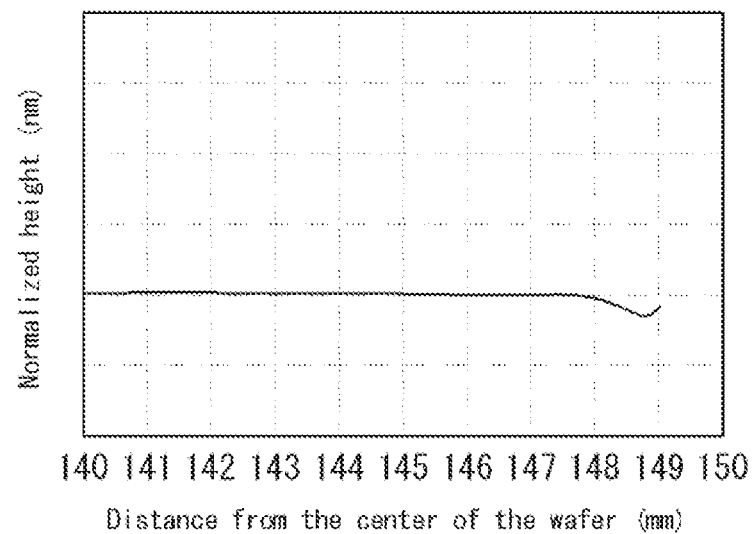

Next, FIG. 5(a) shows the result of measuring the flatness of the rear surface of the produced epitaxial silicon wafer manufactured, by using a flatness measuring apparatus (WaferSight manufactured by KLA-Tencor Corporation). A reference plane was determined as a height of the substrate in the region of 139 mm to 143 mm from the center of the rear surface in a radial direction. FIG. 5(a) reveals that the flatness is degraded at an outer peripheral portion of the rear surface of the epitaxial wafer (when the distance from the wafer center is 145 mm or more).

Experiment Example 2

Next, in this experiment example, the relationship between the film thickness of a first epitaxial film formed on a surface of a semiconductor wafer and the film thickness of a second epitaxial film which attaches to an outer peripheral portion of the rear surface by forming the first epitaxial film was examined. In Experiment Example 1, the epitaxial film with a thickness of 5 μm was formed on the silicon wafer surface; in this experiment example, epitaxial wafers were produced, each of which has a first epitaxial film with a various film thickness by controlling the time for forming the epitaxial film. At that time, epitaxial conditions except for the film formation time was set to be the same as Experiment Example 1.

Figure 6:
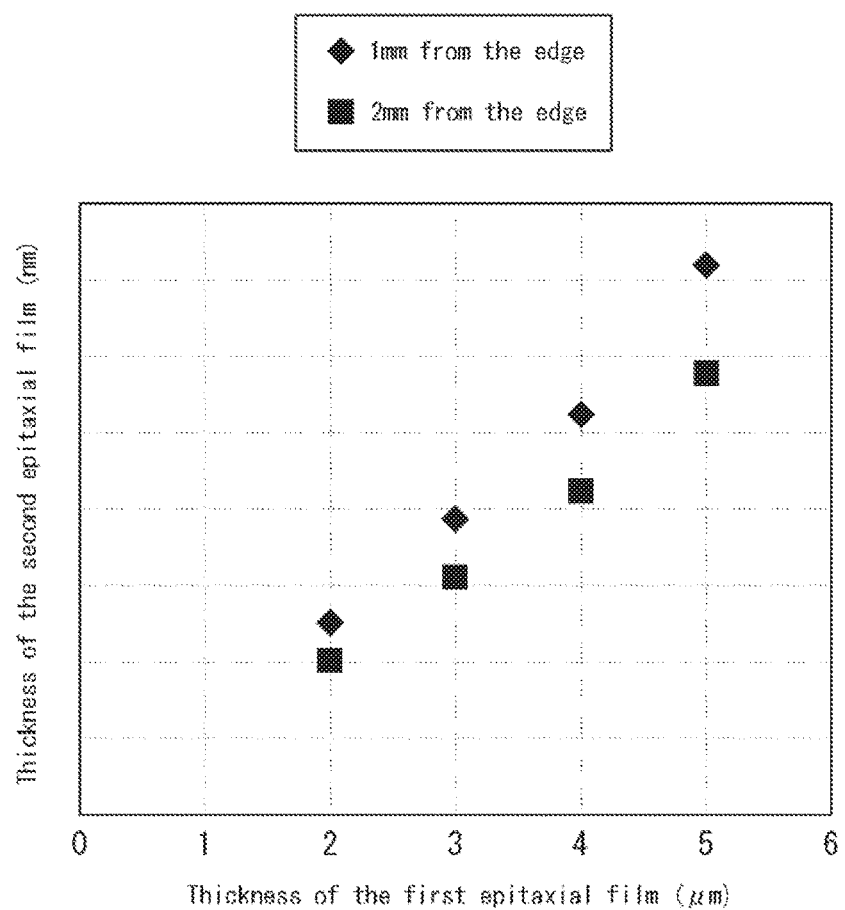
FIG. 6 is a graph showing the relationship between thickness of a first epitaxial film to be formed on a top surface of a semiconductor wafer and thickness of a second epitaxial film attaching to the outer peripheral portion of the rear surface in accordance with Experiment Example 2.

The film thickness of the second epitaxial film which have attached to the outer peripheral portion of the rear surface of each epitaxial wafer was measured at a position inside the wafer which is 1 mm and 2 mm inner than the edge position on the rear surface, respectively. FIG. 6 shows the obtained relationship between the film thickness of the first epitaxial film formed on the top surface of the semiconductor wafer and the film thickness of the second epitaxial film attached to the outer peripheral portion of the rear surface. FIG. 6 reveals that the film thickness of the second epitaxial film attached to the outer peripheral portion of the rear surface has a direct correlation with the film thickness of the first epitaxial film formed on the top surface of the semiconductor wafer.

Note that since the thickness of the second epitaxial film attached to the outer peripheral portion of the rear surface is on the order of tens to hundreds of nanometers, it is difficult to measure the thickness using an FT-IR (Fourier Transform Infrared) metrology film thickness measuring device. Thus, in this experiment example, the measurement was performed as described below. First, the film thickness profile of the first epitaxial film grown on the top surface side of the silicon wafer was measured using an FT-IR metrology film thickness measuring device (QS3300 EG manufactured by Nanometrics Incorporated) and is set as an initial value. After that, the epitaxial wafer was reversed to form an epitaxial film on the rear surface side of the silicon wafer under the same conditions as the growth conditions of the first epitaxial film. This allows the second epitaxial film to be formed also on the outer peripheral portion of the first epitaxial film grown on the top surface of the silicon wafer. The thickness of the epitaxial film, including the thicknesses of the first epitaxial film and the second epitaxial film grown on the top surface of the silicon wafer were measured, and the thickness of the second epitaxial film 30 can be obtained by calculating the difference between the resultant value and the initial value.

Experiment Example 3

Example

In this experiment example, the following experiment was carried out to evaluate the effect of improving the flatness by the roll-off process of the present invention. First, from the measurement result of Experiment Example 2, the film thickness of the second epitaxial film grown on the edge position of the rear surface when epitaxial growth was performed under the same conditions as Experiment Example 1 (the maximum film thickness s shown in FIG. 8(b)) was found. A polishing-process which rolls off only the outer peripheral portion of the rear surface was then conducted under the polishing conditions where the roll-off amount (roll-off amount t shown in FIG. 1(b)) becomes equal to the thickness s.

Particularly, the rear surface of the silicon wafer was held by adsorption using a mirror-polishing apparatus for mirror-polishing a beveled portion as shown in FIGS. 3(a) and 3(b). The wafer was rotated at a predetermined velocity, and concurrently, a polishing agent of an alkaline aqueous solution containing colloidal silica was supplied to perform mirror-polishing by bearing a polishing head covered with a polishing cloth on the outer peripheral portion area on the rear surface of the silicon wafer while controlling the angle of the polishing head. The polishing conditions here are as follows. The mirror-polishing process was performed on a region from the edge position to the position 5 mm inside therefrom on the rear surface of the silicon wafer for two minutes by making the polishing cloth incline at an angle of 15° against a horizontal surface of the wafer.

Next, the surface of the rolled off silicon wafer was finish-polished by mirror-polishing process and cleaned (RCA clean). After that, epitaxial growth was performed under the same conditions as Experiment Example 1 to form an epitaxial film with a thickness of 5 mm on the silicon wafer surface. FIG. 5(b) shows the result of measuring the flatness under the same manner as Experiment Example 1.

Thus, it is shown that the rear surface of the epitaxial silicon wafer manufactured by Experiment Example 3 (Example) was found to be flatter than that of the epitaxial silicon wafer manufactured by Experiment Example 1 (Comparative Example). Besides, since this production method does not involve polishing of the top and rear surfaces of the epitaxial film, it can provide a high-grade epitaxial silicon wafer with neither PID defects on the rear surface caused by a polishing process nor flaws or adsorption marks left on the surface.

Experiment Example 4

In this experiment example, the following experiment was carried out to examine how much flatness of the outer peripheral portion of the rear surface differ depending on the varying thickness of the first epitaxial film with or without the roll-off process of the present invention.

First, as a comparative example, with respect to a silicon wafer having the same specification as the silicon wafer used in Experiment Example 1 (Comparative Example), the time for forming the epitaxial film was controlled to form epitaxial wafers having the first epitaxial film with variously changed thickness. On this occasion, the same epitaxial conditions as Experiment Example 1 were used except for the film formation time. In particular, 25 epitaxial silicon wafers were produced for each of four film thickness standards of the first epitaxial film of 2 µm, 3 µm, 4 µm, and 5 µm.

Next, as an example, the roll-off amount of the case where the film thickness of the first epitaxial films are 2 µm, 3 µm, 4 µm, and 5 µm was found based on the correlation relationship found in Experiment Example 2, and the 25 silicon wafers per each thickness were subjected to a roll-off process on the rear surface in the same procedural steps as Experiment Example 3. After that, a first epitaxial film was formed in the like manner as the above comparative example to form an epitaxial silicon wafer.

Figure 7:
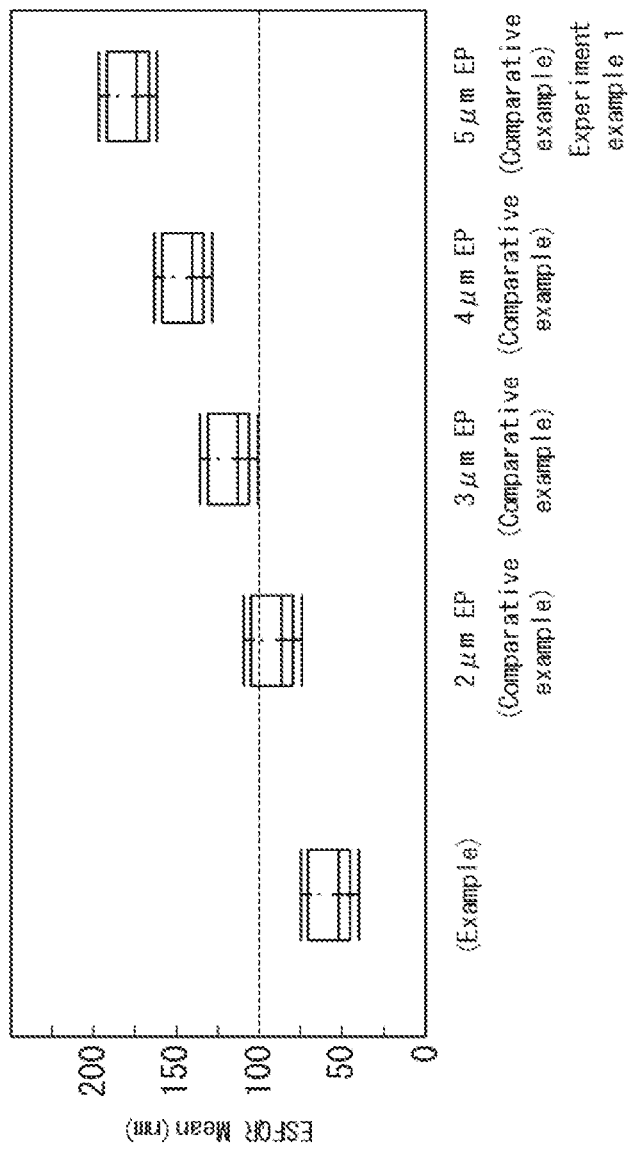
FIG. 7 is a graph showing ESFQR of an outer peripheral portion of a rear surface when thickness of a first, epitaxial film to be formed on a top surface of a semiconductor wafer is 2 μm, 3 μm, 4 μm, or 5 μm (Experiment Example 1) (Comparative Examples) and ESFQR of an outer peripheral portion of a rear surface when a first epitaxial film having a thickness of 2 μm, 3 μm, 4 μm, or 5 μm is formed in the like manner after performing the roll-off process of the present, invention (Example), in accordance with Experiment Example 4.

With respect to the 100 epitaxial wafers obtained by example and the 100 epitaxial wafers obtained by comparative example, ESFQR of the outer peripheral portion of the rear surface was measured by way of the foregoing method. The results are shown in FIG. 7. As apparent from FIG. 7, the epitaxial silicon wafers obtained by Example is found to achieve ESFQRmean value of 100 nm or less regardless of the thickness of the first epitaxial film. On the other hand, the epitaxial silicon wafers obtained by Comparative Example were significantly affected by the film thickness of the first epitaxial film. Some of them achieved ESFQRmean values of 100 nm or less in 2 µm-thick epitaxial growth; however, it was found impossible to achieve the ESFQRmean value of 100 nm or less in epitaxial growth for the thickness of 3 µm or more.

INDUSTRIAL APPLICABILITY

According to the present invention, an outer peripheral portion of a rear surface of a semiconductor wafer is previously rolled off purposely before forming an epitaxial film, and then the epitaxial film is formed. Thus, the present invention can provide an epitaxial wafer having a highly flat rear surface obtained without polishing top and rear surfaces of the wafer after forming the epitaxial film and a method of producing the same.

REFERENCE SIGNS LIST

1: ring-shaped polishing cloth
2: rotation stage
3: polishing pad (for polishing process of outer peripheral portion)
4, 5, 6: polishing pad (for mirror-polish of beveled portion)
10: semiconductor wafer
11: beveled portion
12a: top surface of semiconductor wafer
12b: rear surface of semiconductor wafer
13a: edge on top surface side
13b: edge on rear surface side (before rolling-off)
13c: edge on rear surface side (after rolling-off)
14: outer peripheral portion
20: first epitaxial film
20a: surface of first epitaxial film
30: second epitaxial film
31: surface of second epitaxial film
100: epitaxial wafer

The invention claimed is:
1. A method of producing an epitaxial wafer, comprising:
a step of preparing a semiconductor wafer having a beveled portion formed on its end portion, a first surface, a second surface opposite to the first surface, and edges on both of the first surface and the second surface, wherein each edge has a boundary with the beveled portion;
a step of processing an outer peripheral portion of the first surface to form a roll-off region having a width of 5 mm or less, the outer peripheral portion is extending outward of the wafer from a predetermined position inner than the position of the edge on the first surface; and
a step of forming a first epitaxial film on the second surface to obtain an epitaxial wafer,
wherein a roll-off amount of the outer peripheral portion is determined in a range of 50 nm to 500 nm based on a film thickness of a second epitaxial film which attaches to the outer peripheral portion of the first surface when the first epitaxial film is formed on the second surface,
wherein the first epitaxial film formed on the second surface has a thickness of 3 µm or more,
wherein an ESFQRmean value which represents the flatness of a surface including at least a surface of the second epitaxial film on the first surface is 100 nm or less, immediately after the first epitaxial film is formed and before any treatment is applied to top and rear surfaces of the epitaxial wafer.
2. The method of producing an epitaxial wafer according to claim 1, wherein the processing step is performed by a process of polishing the outer peripheral portion.
3. The method of producing an epitaxial wafer according to claim 2, further comprising:
a step of rough-polishing at least one of the first surface and the second surface of the semiconductor wafer,
wherein the process of polishing the outer peripheral portion is performed after the rough-polishing step.
4. The method of producing an epitaxial wafer according to claim 3, further comprising:
a step of finish-polishing at least the second surface of the semiconductor wafer before the step of forming the first epitaxial film, wherein the process of polishing the outer peripheral portion is performed before the finish-polishing step.

5. The method of producing an epitaxial wafer according to claim 4, wherein the process of polishing the outer peripheral portion is performed by using a ring-shaped polishing cloth having a size corresponding to the outer peripheral portion of the first surface.

6. The method of producing an epitaxial wafer according to claim 2, further comprising:
  a step of rough-polishing at least one of the first surface and the second surface of the semiconductor wafer, and
  a step of finish-polishing at least one of the first surface and the second surface of the semiconductor wafer before the step of forming the first epitaxial film,
  wherein a process of mirror-polishing of the beveled portion and the process of polishing the outer peripheral portion are performed in parallel between the rough-polishing step and the finish-polishing step.

7. An epitaxial wafer comprising:
  a semiconductor wafer having a beveled portion formed on its end portion, a first surface, a second surface opposite to the first surface, and edges on both of the first surface and the second surface, wherein each edge has a boundary with the beveled portion;
  a first epitaxial film with a thickness of 3 μm or more formed on the second surface of the semiconductor wafer;
  an outer peripheral portion of the first surface having a roll-off region, a width and a roll-off amount of which is 5 mm or less and 50 nm to 500 nm, respectively; and
  a second epitaxial film formed on the roll-off region of the outer peripheral portion of the first surface,
  wherein an ESFQRmean value which represents the flatness of a surface including at least a surface of the second epitaxial film on the first surface is 100 nm or less, and
  no PIDs (Polishing Induced Defects) exist on a rear surface of the epitaxial wafer, and neither flaw nor contact mark exists on a surface of the first epitaxial film.

8. The method of producing an epitaxial wafer according to claim 3, wherein the process of polishing the outer peripheral portion is performed by using a ring-shaped polishing cloth having a size corresponding to the outer peripheral portion of the first surface.

9. The method of producing an epitaxial wafer according to claim 2, further comprising:
  a step of finish-polishing at least the second surface of the semiconductor wafer before the step of forming the first epitaxial film,
  wherein the process of polishing the outer peripheral portion is performed before the finish-polishing step.

10. The method of producing an epitaxial wafer according to claim 2, wherein the process of polishing the outer peripheral portion is performed by using a ring-shaped polishing cloth having a size corresponding to the outer peripheral portion of the first surface.

* * * * *